United States Patent [19]

Chan et al.

[11] Patent Number: 4,603,803
[45] Date of Patent: Aug. 5, 1986

[54] WIRE BONDING APPARATUS

[75] Inventors: Lo Kwan Chan; Wai Sau Li, both of Hong Kong, Hong Kong

[73] Assignee: ASM Assembly Automation, Ltd., Kowloon, Hong Kong

[21] Appl. No.: 718,936

[22] Filed: Apr. 2, 1985

Related U.S. Application Data

[63] Continuation of Ser. No. 410,945, Aug. 24, 1982, abandoned.

[51] Int. Cl.[4] .............................................. B23K 37/02
[52] U.S. Cl. ...................................... 228/4.5; 228/6.2
[58] Field of Search ...................... 228/1, 4.5, 6.2, 5.1, 228/102; 219/56.1, 56.21; 29/739, 740

[56] References Cited

U.S. PATENT DOCUMENTS

| 2,755,760 | 7/1956 | Fermanian et al. | 228/6.2 |
| 3,672,556 | 6/1972 | Diepeveen | 228/4.5 |
| 3,863,827 | 2/1975 | Foulke et al. | 228/1 |
| 3,934,783 | 1/1976 | Larrison | 228/110 |
| 3,941,294 | 3/1976 | Johannsmeier | 228/4.5 |
| 4,037,072 | 7/1977 | Johnson | 228/4.5 |
| 4,213,556 | 7/1980 | Persson et al. | 228/4.5 |
| 4,234,117 | 11/1980 | Foulke | 228/4.5 |
| 4,239,144 | 12/1980 | Elles et al. | 228/4.5 |
| 4,444,349 | 4/1984 | Bilane et al. | 228/102 |

FOREIGN PATENT DOCUMENTS

| 11979 | 6/1980 | European Pat. Off. . |
| 588986 | 6/1947 | United Kingdom . |
| 674816 | 7/1952 | United Kingdom . |
| 807852 | 1/1959 | United Kingdom . |
| 812287 | 4/1959 | United Kingdom . |
| 1341259 | 12/1973 | United Kingdom . |
| 1363042 | 8/1974 | United Kingdom . |
| 1530537 | 11/1978 | United Kingdom . |
| 2004222 | 3/1979 | United Kingdom . |
| 1550671 | 8/1979 | United Kingdom . |
| 1577917 | 10/1980 | United Kingdom . |
| 2047596 | 12/1980 | United Kingdom . |

Primary Examiner—Nicholas P. Godici
Assistant Examiner—M. Jordan
Attorney, Agent, or Firm—Harry M. Weiss & Associates

[57] ABSTRACT

A wire-bonding apparatus which employs a belt-and-pulley driven, spring-returned Z-motion plate to appropriately locate a wire-axis-aligned, solenoid operated, wire feed-and-tear apparatus so that bonds can be quickly and effectively made upon devices located on an X-Y movement table.

4 Claims, 10 Drawing Figures

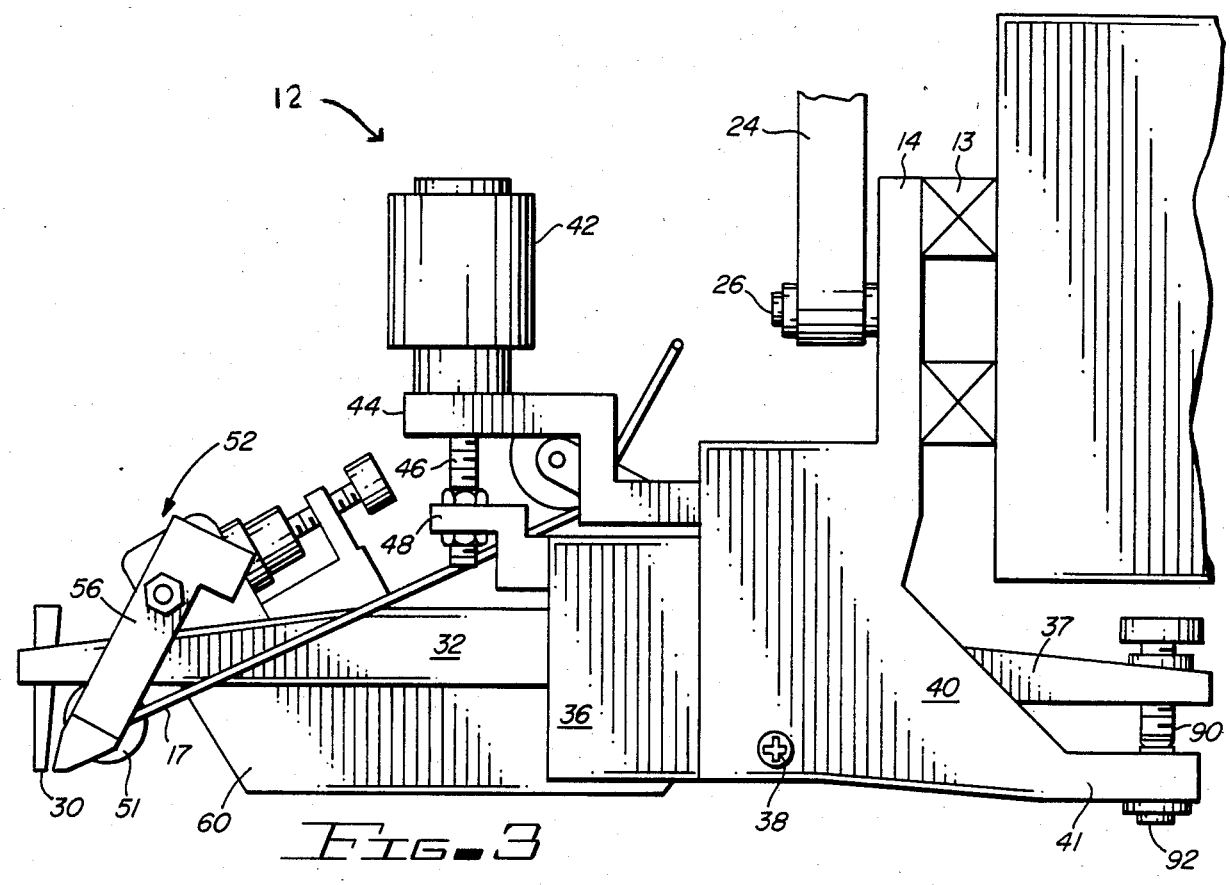
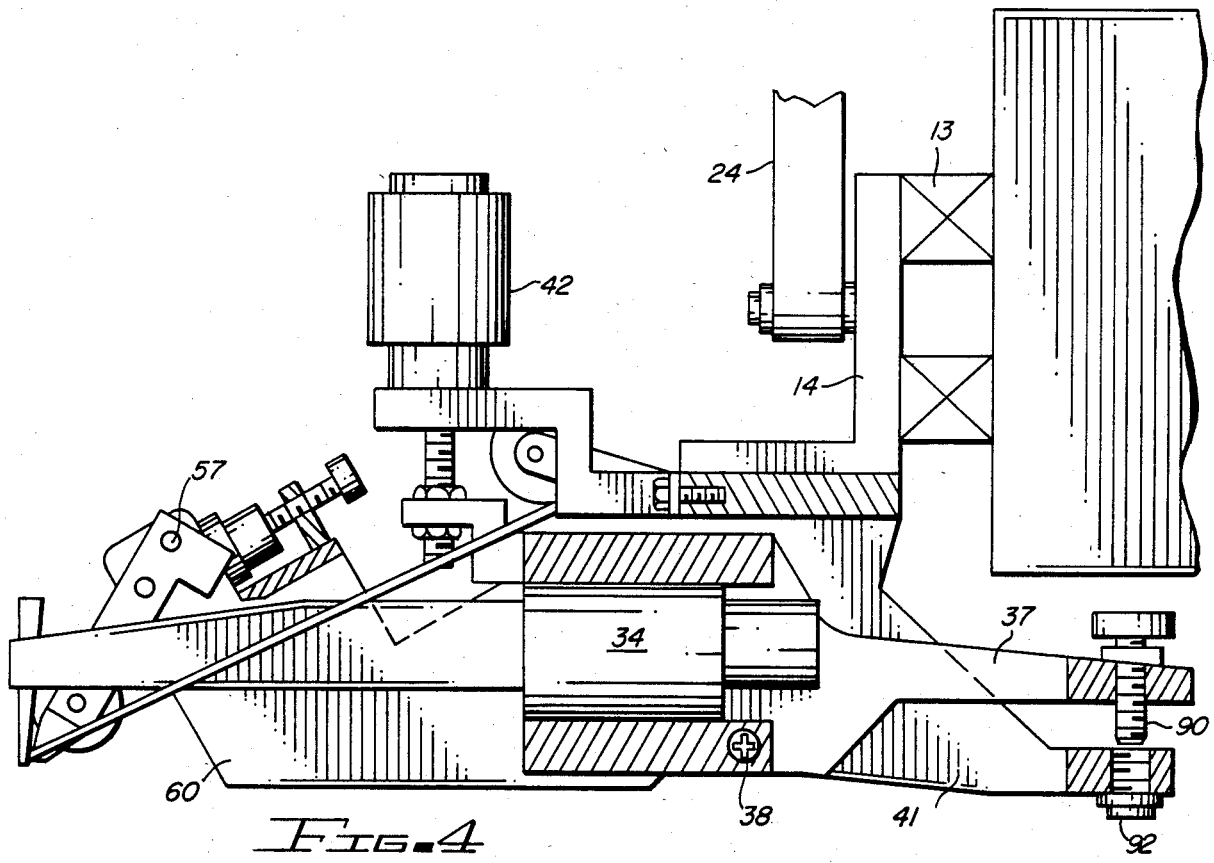

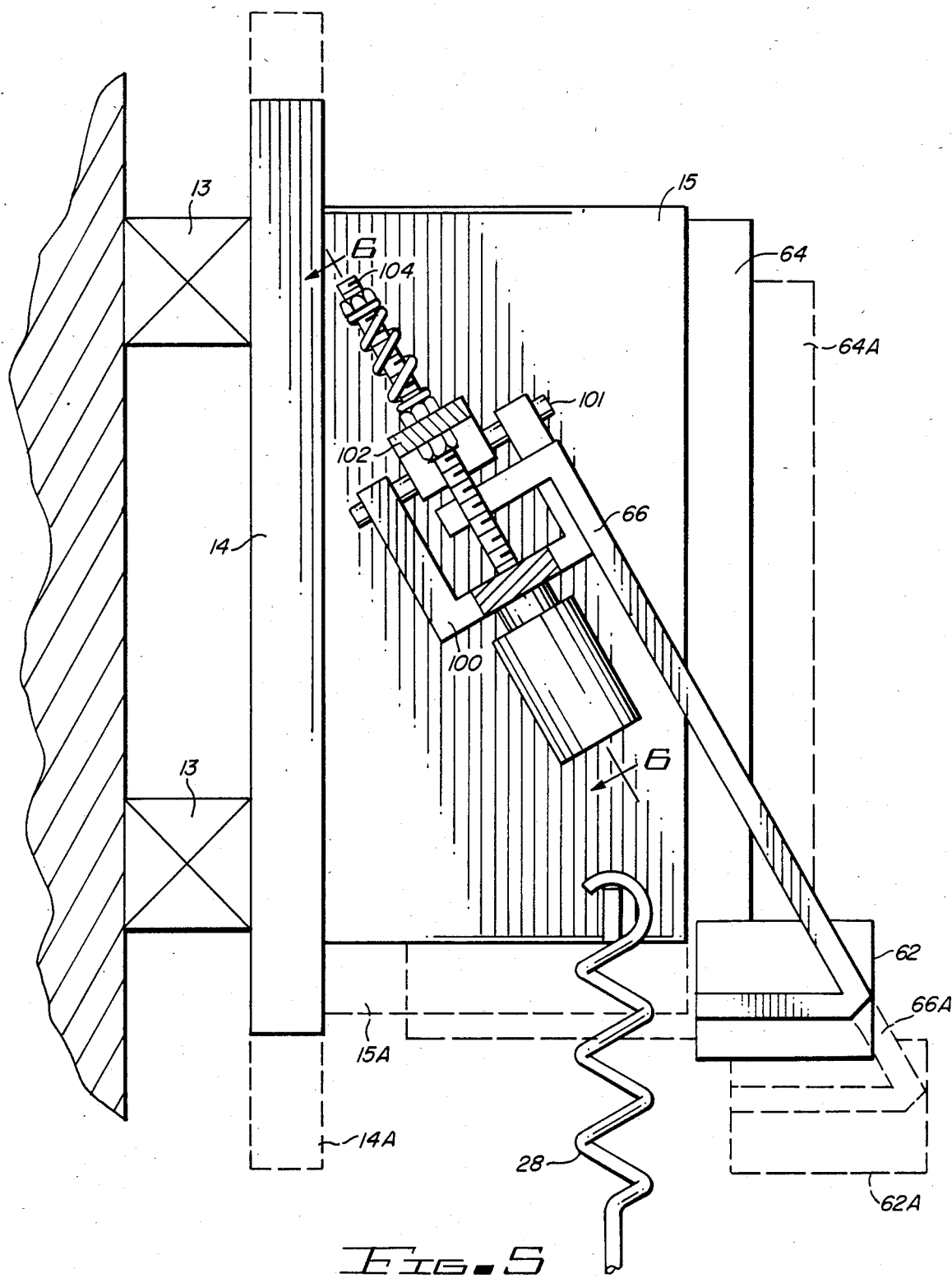

WIRE BONDING APPARATUS

This is a continuation of application Ser. No. 410,945, filed Aug. 24, 1982, abandoned Apr. 2, 1985.

DESCRIPTION OF THE INVENTION

1. Field of the Invention

This invention relates to semiconductor device manufacturing equipment, presenting a wedge-type aluminum wire bonder for electrically connecting a semiconductor chip to a lead frame. Specifically, the invention presents a wire feed-and-tear linkage mounted on a vertically mobile Z-drive plate.

2. Description of the Prior Art

In the past, semiconductor manufacturing had developed rapidly. Electrically connecting a semiconductor chip to a lead frame normally involved bonding fine wires to respective pads on the chip and the frame. Initially, such operations were conducted manually, with the aid of a microscope.

A need existed for a reliable, low-cost, but high speed, machine to effect the wiring connections between a semiconductor chip and its lead frame.

BRIEF DESCRIPTION OF THE DRAWINGS

FIG. 3 is a side elevational view of the bonding head of FIG. 2.

FIG. 4 is a partially sectioned view, taken in the same direction as FIG. 3.

FIG. 5 is an elevational view of the feed-and-tear motion of the bonding head support arm of the bonder of FIG. 1.

SUMMARY OF THE INVENTION

It is an object to provide a wire feed-and-tear apparatus to permit a wire bonder to quickly make separate electrical connections to a semiconductor chip.

It is another object to provide a vertically positionable wire feed-and-tear apparatus coupled to a wire bonder to quickly make separate electrical connections between bonding pads resting at different elevations.

It is an object to provide a wire feed-and-tear device which requires only a single clamp to operate.

It is a further object to provide a low-cost vertically linear drive for a wire bonding apparatus.

DESCRIPTION OF THE PREFERRED EMBODIMENTS

In accord with a first embodiment of this invention, a wire-feed and wire-tear mechanism for a wire-bonding apparatus is disclosed, comprising: transducer means having a transducer horn provided with an orthogonally mounted transducer probe for providing a bonding force on an end surface of the probe; wire source means having a wire leading to the end surface; and clamp means having a releasable clamp provided with a translation axis parallel to the axis of the wire leading to the end surface for feeding and tearing the wire.

In accordance with another embodiment of this invention, a vertical drive mechanism for the bonding head of a wire bonding apparatus, comprising: a frame; a plate vertically and slidably coupled to the frame and coupled to the bonding head; belt means having a reelable belt for coupling the frame to the plate; and bobbin means for reeling the belt to move the plate relative to the frame.

The foregoing and other objects, features and advantages of this invention will be apparent from the drawings and the following, more particular, description of the preferred embodiments of the invention.

Figure 1:
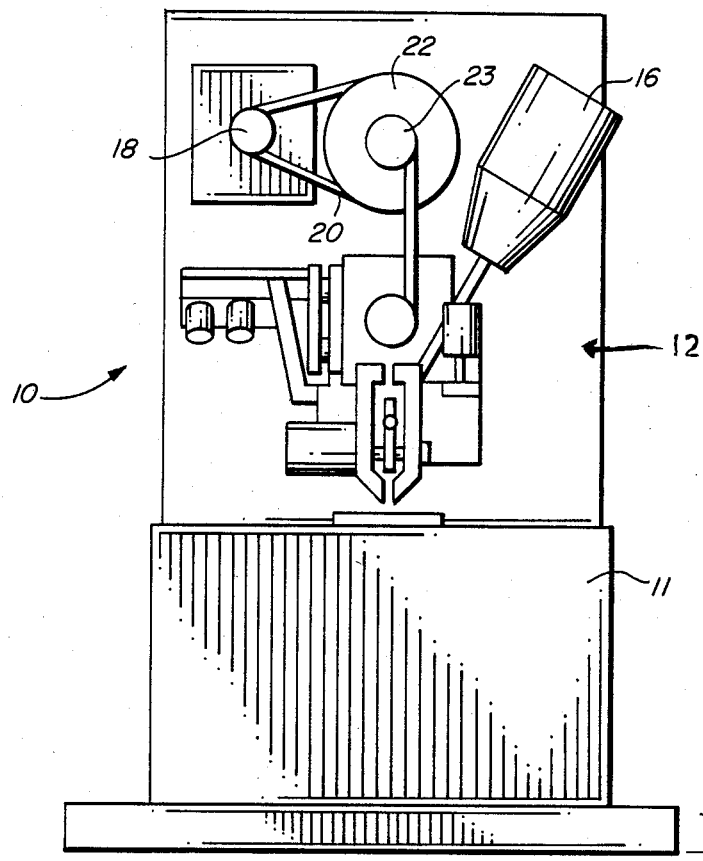
FIG. 1 is a frontal elevational view, with portions omitted for clarity, of a wire bonder employing the invention disclosed herein.
Figure 2:
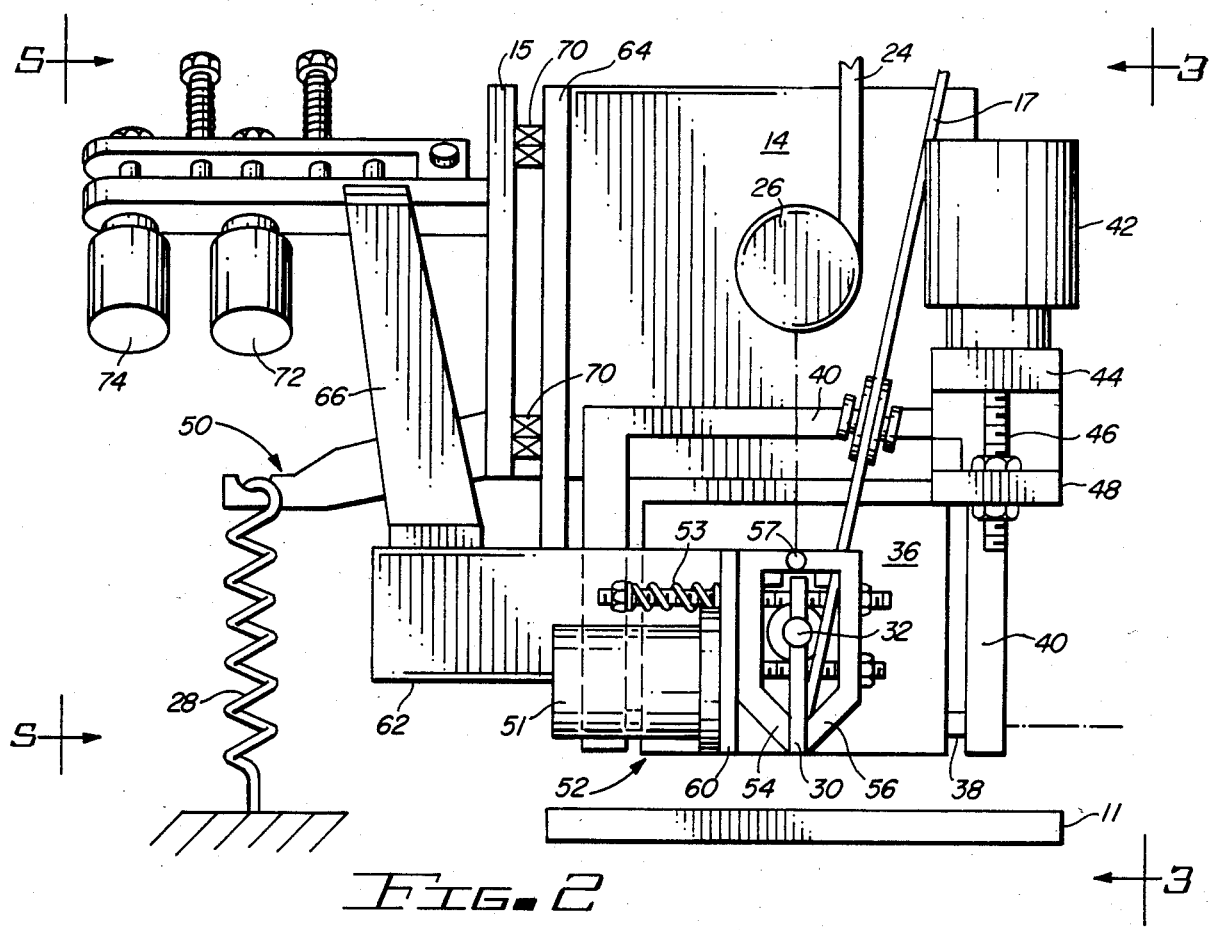
FIG. 2 is an enlarged frontal elevational view of the bonding head of the bonder of FIG. 1.

In FIGS. 1 and 2, a wire bonder is shown generally by reference number 10. In FIG. 1, certain details are omitted for clarity. The novel bonder 10 adjoins and cooperates with an X-Y movement table 11, of conventional design.

The bonder 10 includes a bonding head assembly, shown generally by reference number 12. The bonding head 12 is mounted upon a Z-motion plate 14. The Z-motion plate 14 is slidably mounted on the frame of the bonder 10 to permit the bonding head 12 to be vertically shifted, as hereafter described. A wire spool 16 supplies bonding wire 17 to the bonding head 12.

Stepper motor 18 reversibly rotates a primary belt 20 to drive an idler pulley 22. The primary belt 20 is preferably a cogged-type belt, to insure a positive drive. The idler pulley 22 is mounted, in rotational freedom, to the frame of the bonder 10. The idler pulley 22 also anchors a strap 24 about a bobbin 23. Rotation of the idler pulley causes the strap 24 to wind about, or unwind from, the bobbin 23. The strap 24 is anchored at an opposed end to a lug 26 on the Z-motion plate 14. As the strap 24 is wound about the bobbin 23, the lug 26 and the Z-motion plate 14 are both lifted. A tension spring 28, connected between the Z-motion plate 14 and the frame of the bonder 10, loads the bonding head 12 down toward the X-Y table 11.

FIG. 2 is a frontal elevational view similar to that of FIG. 1, showing the Z-motion plate 14 and connected linkage in an enlarged detail. A bonding probe 30 defines the actual bonding wedge surface, and is fixed in a transducer horn 32. The transducer horn 32 connected to a transducer 34, as best shown in FIG. 4. The transducer 34 is mounted in a transducer holder 36. The transducer holder 36 is connected by pivots, a first of which is shown by reference number 38, to a pivot frame 40. The pivot frame 40 is rigidly supported by the Z-motion plate 14.

A bond-force solenoid 42 is rigidly mounted on bracket 44, which bracket 44 is connected by the pivot frame 40 to the Z-motion plate 14. The bond-force solenoid 42 has a shaft 46, connected to a bracket 48 on the transducer holder 36. The bond-force solenoid 42 pivots the transducer holder 36 about the pivots 38, to control the pressure applied to the wedge surface of the bonding wedge probe 30 during the bonding operation.

Wire clamp assembly 50 includes a clamp solenoid 51, which operates a clamp 52. The clamp 52 has opposed halves 54, 56 respectively flanking the transducer horn 32. The clamp 52 is normally held shut by spring 53.

The clamp solenoid 51 operates the clamp 52, to selectively grip and release the bonding wire 17, by defeating the force of the spring 53 and thereby pivoting the halves 54, 56 about a clamp pivot 57. The clamp half 54 is rigidly coupled to a clamp frame (not shown). The clamp frame includes a solenoid-and-clamp mount bracket 60, a connector beam 62, a bearing plate 64 and an actuator arm 66. The connector beam 62 rigidly connects the solenoid mount bracket 60 to the bearing plate 64 and to the actuator arm 66.

In combination, the connector beam 62 and the other components mounted thereon, including the clamp solenoid 51, the clamp 52, the actuator arm 66 and the bearing plate 64, form a rigidly connected sub-unit of the clamp assembly 50. Bearings 70 mount the sub-unit of the wire clamp assembly 50 to a bearing-mount plate 15, rigidly projecting from the Z-motion plate 14. As shown more fully in FIG. 5, the bearings 70 are aligned to permit the clamp 52 to travel directly along the axis of the wire 17, defined as the wire approaches the clamp 52.

The other sub-unit of the wire clamp assembly 50 includes the solenoid-actuated feed-and-tear drive assembly. The feed-and-tear drive assembly includes a tear solenoid 72 and a feed solenoid 74. The feed-and-tear drive assembly is more fully described in conjunction with the explanation of FIGS. 5, 6, 7, 8, 9 and 10.

Turning then to FIG. 3, an elevational view taken along line 3—3 of FIG. 2 is shown. Slide bearings 13 couple the Z-motion plate 14 to the bonder 10, and permit the Z-motion plate to move vertically.

The transducer holder 36 defines a tail 37, which mounts an adjustable, electrically isolated contact 90. The pivot housing defines a similar cantilevered arm 41, which mounts a corresponding electrical contact 92. A spring (not shown) normally loads the contacts 90, 92 open. When the contacts 90, 92 close, the transmitted signal indicates that the transducer probe 30 has made full contact with the surface to be bonded, and that the bond force solenoid 42 and the transducer 34 can be energized to produce the finished bond.

In FIG. 4, a partial section of the view of FIG. 3 is shown. It can be clearly seen how the transducer 34 mounts within the transducer holder 36 (see FIG. 3). Also shown are the clamp pivot 57, the shaft of the clamp solenoid 51 and the bolt for the clamp spring 53 (see FIG. 2).

Figure 6:
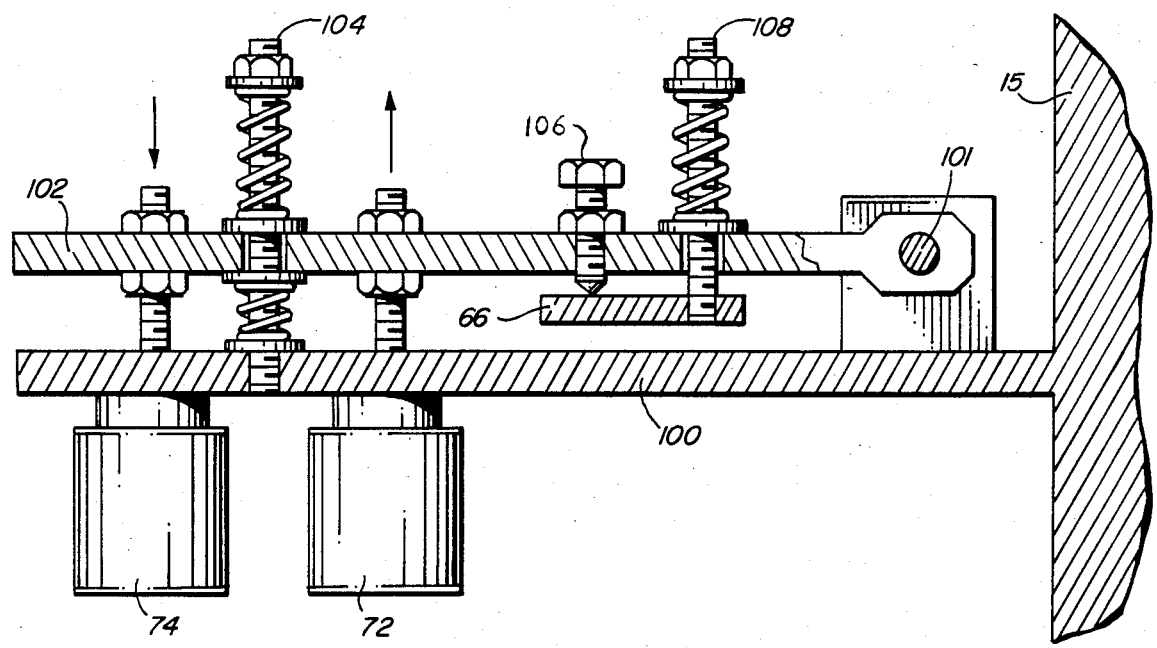
FIG. 6 is a view taken in the direction shown by 6—6 in FIG. 5, showing the feed-and-tear drive linkage.

The structure of the feed-and-tear drive assembly 70 is described with the assistance of FIGS. 5 and 6. FIG. 5 is a sectional view taken along line 5—5 of FIG. 2. FIG. 6 is a sectional view taken along line 6—6 of FIG. 5.

FIG. 5 is an enlarged sectional view taken along 5—5 as shown in FIG. 2. The Z-motion plate 14 supports the bearing-mount plate 15. The Z-motion plate 14 is supported from the frame of the bonder 10 by vertical slide bearings 13. The lower limit of vertical travel for the Z-motion plate is shown by reference number 15A.

A solenoid-mounting bracket 100 is rigidly connected to the bearing-mount plate 15. As shown best in FIGS. 2 and 6, the solenoid-mounting bracket 100 supports both the tear solenoid 72 and the feed solenoid 74. The solenoid-mounting bracket 100 also defines a yoke which supports a pivot 101. The pivot 101 lies nominally at right angles with the axis of the wire 17 as it approaches the clamp 52, and also lies parallel to the plane of motion of the bearing plate 64. The pivot 101 pivotally supports a pivot-transfer arm 102.

The bearing plate 64 slidably supports both the connector beam 62 and the actuator arm 66. The travel axis, and available limit of motion, for the beam 62, plate 64 and arm 66 are shown by the dashed line correspondingly labeled 62A, 64A and 66A.

In FIG. 6, the solenoid mounting bracket 100 is shown mounted to the bearing-mount plate 15. The pivot-transfer arm 102 is pivotally coupled to the solenoid-mounting bracket 100, and thus indirectly to the bearing-mount plate 15, with the pivot lying generally at right angles to the axis of the wire 17 as it approaches the clamp 52. Spring-and-post combination 104 is anchored to the solenoid mount bracket 100, and uses dual springs to define a neutral position for the pivot-transfer arm 102 with respect to the solenoid-mount bracket 100. Adjustable probe 106 contacts the actuator arm 66, and causes it to travel downward when the pivot-transfer arm 102 is pivoted downward. A second, actuator-arm, spring-and-post combination 108 is anchored to the actuator arm 66, and keeps the probe 106 in contact with the actuator arm 66 when the pivot-transfer arm is pivoted upward.

Figure 7:
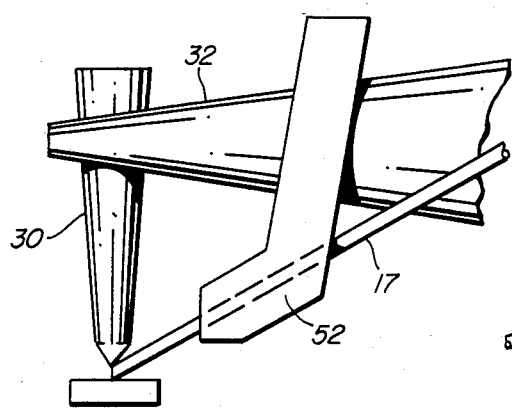
FIG. 7 shows the relationship of the clamp and bonding probe of the bonding head of FIG. 1 as a first bond occurs.

Referring additionally to FIG. 7, the clamp 52 is shown in a rest position with respect to the bonding probe 30 immediately above the desired bonding site. The bond-force solenoid 42 and the transducer 34 can be energized to thereupon effect a bonded connection.

Figure 8:
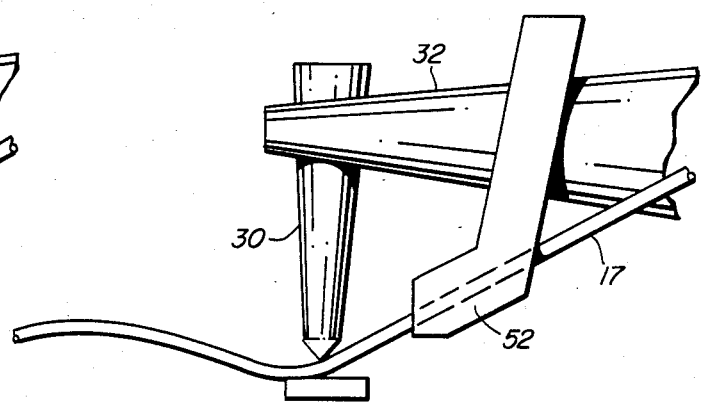
FIG. 8 shows the clamp and bonding probe of FIG. 7 as a second bond occurs.

In FIG. 8, the clamp 52 has been released, the Z-motion plate 14 lifted by winding the strap 24 about the bobbin 23. A length of the bonding wire 17 can run freely through the clamp 52. A second bond is shown being effected, to secure a complete electrical connection. It can be seen that the clamp 52 remains in the neutral position with respect to the bonding probe 30.

Figure 9:
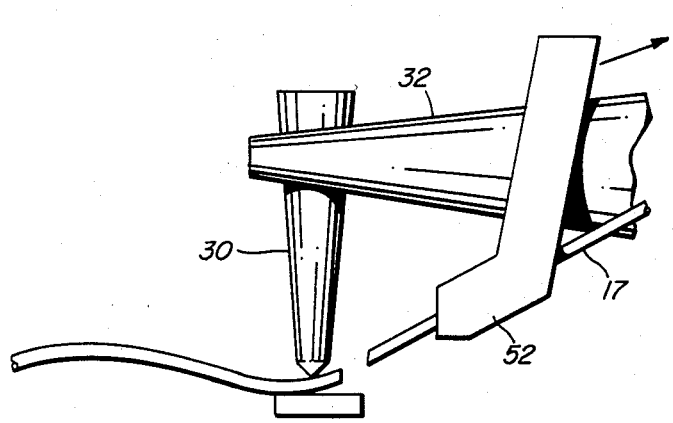
FIG. 9 shows the clamp and bonding probe of FIG. 8 as the clamp is pulled back to the tear position.

In FIG. 9, the clamp 52 has been secured to grip the bonding wire 17, and has then been withdrawn along the axis of the wire 17 by the action of the tear solenoid 72. That is, the tear solenoid 72 pivots the pivot-transfer arm 102 "up", the actuator arm spring 108 pulls the actuator arm 66 "up", and the clamp 52 itself is thereby pulled "up" along the axis of the wire 17 and away from the bonding site. As the clamp 52 travels away, the wire 17 is broken at its weakest point, namely adjacent the bond.

Figure 10:
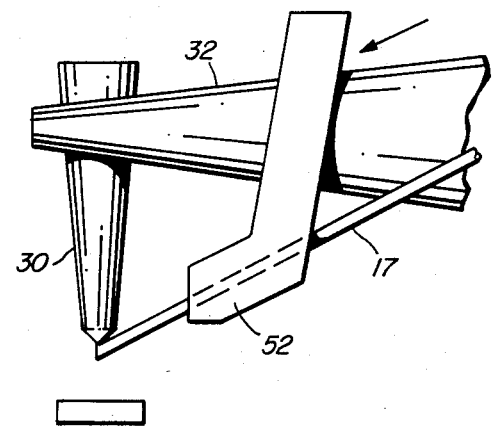
FIG. 10 shows the clamp and probe of FIG. 9 as the clamp is advanced to the feed position.

In FIG. 10, the tear solenoid 72 has been released, and, without releasing the clamp solenoid 51, the feed solenoid 74 has been actuated to project the freshly broken end of the wire 17 beneath the bonding probe. The Z-motion plate 14 is then lowered to bring the probe 30 to bear to sandwich the wire 17 against the next bonding pad, and another bond is thence secured. As it is, the feed solenoid 74 is released, and the clamp 52 opened to permit the clamp 52 to return to the "neutral" position, shown in FIG. 7.

Thus, it can be seen and appreciated that an efficient mechanism is provided for providing wire bonds for semiconductor devices. In particular, both a highly effective, low cost Z-motion drive is provided, and an advantageous wire feeding- and tearing-mechanism is shown.

While the invention has been particularly described and shown with reference to preferred embodiments thereof, it will be understood by those skilled in the art that the foregoing and other changes in form and details may be made therein without departing from the spirit and scope of the invention.

We claim:

1. A wire-feed and wire-tear mechanism for a wire-bonding apparatus, comprising:
   transducer means for providing a bonding force on an end surface of a bonding probe including a transducer horn provided with an orthogonally mounted bonding probe;
   bond force solenoid means operably coupled to said transducer means for pivoting said transducer means and controlling the pressure applied to said end surface of said bonding probe;
   wire source means operably coupled to said transducer means for supplying wire to said end surface along a diagonal axis at an acute angle from a vertical axis;
   diagonally movable clamp means having a releasable clamp provided with a translation axis parallel to said diagonal axis of said wire being supplied to said end surface for movement in a reciprocal direction with said wire and for feeding and tearing said wire; and
   solenoid actuated separate feed and separate tear drive means operably coupled to said clamp means for causing said clamp means to move forward and backward with respect to said end surface of said bonding probe parallel to said diagonal axis of said wire for feeding said wire and tearing said wire during a bonding procedure.

2. The wire-feed and wire-tear mechanism of claim 1, further comprising clamp solenoid means operably coupled to said claim means for causing said clamp means to grip and release said wire.

3. The wire-feed and wire-tear mechanism of claim 2 wherein said transducer means further includes a transducer connected to said transducer horn and a transducer holder connected to said transducer and pivotally coupled to a pivot frame.

4. The wire-feed and wire-tear mechanism of claim 3 wherein said solenoid activated separate feed and separate tear drive means comprise a first solenoid means for moving said clamp means in said forward direction parallel to said diagonal axis of said wire; a second solenoid means for moving said clamp means in said backward direction parallel to said diagonal axis of said wire; a solenoid mounting bracket connected to said first and second solenoid means and to a bearing-mount plate; a pivot transfer arm pivotally coupled to said solenoid mounting bracket; a first spring-and-post combination connected to said solenoid mounting bracket and operably coupled to said pivot transfer arm; an adjuster probe connected to said pivot transfer arm; a second spring-and-post combination operably coupled to said pivot transfer arm; and an actuator arm connected to said second spring-and-post combination and operably coupled to said adjuster probe and said clamp means.

* * * * *